United States Patent
Lee

(10) Patent No.: US 7,551,511 B2
(45) Date of Patent: Jun. 23, 2009

(54) NAND FLASH MEMORY DEVICE AND METHOD OF FORMING A WELL OF A NAND FLASH MEMORY DEVICE

(75) Inventor: Hee Youl Lee, Kyungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 114 days.

(21) Appl. No.: 11/010,987

(22) Filed: Dec. 13, 2004

(65) Prior Publication Data

US 2005/0253198 A1 Nov. 17, 2005

(30) Foreign Application Priority Data

May 11, 2004 (KR) .................. 10-2004-0033207

(51) Int. Cl.
*G11C 8/00* (2006.01)
(52) U.S. Cl. .................. 365/230.04; 365/185.11; 365/185.17
(58) Field of Classification Search ............ 365/230.04, 365/185.11, 185.17, 185.33, 185.13, 185.18, 365/104; 257/316, 321, 544, 548
See application file for complete search history.

(56) References Cited

U.S. PATENT DOCUMENTS

| | | | | | |
|---|---|---|---|---|---|
| 5,625,590 | A | * | 4/1997 | Choi et al. ............. | 365/185.17 |
| 5,923,587 | A | * | 7/1999 | Choi ...................... | 365/185.11 |
| 6,052,305 | A | * | 4/2000 | Yang et al. ............. | 365/185.18 |
| 6,475,846 | B1 | * | 11/2002 | Marotta et al. .......... | 438/201 |
| 6,512,702 | B1 | * | 1/2003 | Yamamura et al. ...... | 365/185.33 |
| 6,636,441 | B2 | * | 10/2003 | Taura ..................... | 365/185.28 |
| 7,272,042 | B2 | * | 9/2007 | Nakai ..................... | 365/185.17 |
| 2002/0118569 | A1 | * | 8/2002 | Jeong et al. ............. | 365/185.18 |
| 2005/0253198 | A1 | * | 11/2005 | Lee ......................... | 257/371 |

FOREIGN PATENT DOCUMENTS

| | | |
|---|---|---|
| JP | 11-297865 | 10/1999 |
| JP | 2002-151605 | 5/2002 |
| KP | 10-2004-0083172 | 10/2004 |

OTHER PUBLICATIONS

Korean-language Official Action dated Jan. 17, 2006, issued by the Korean Intellectual Property Office, in connection with the Korean counterpart priority application No. 10-2004-0033207.
Official action dated May. 11, 2007 for counterpart Chinese Application No. 200510003767.0 (Chinese original and partial English translation included).

* cited by examiner

*Primary Examiner*—Dang T Nguyen
(74) *Attorney, Agent, or Firm*—Marshall, Gerstein & Borun LLP

(57) ABSTRACT

Disclosed herein are a NAND flash memory device and a method of forming a well of the NAND flash memory device. Triple wells of a NAND flash memory device are formed within a cell region in plural. A cell block including flash memory cells is formed on the triple wells. Accordingly, during an erase operation of a flash memory device, a stress time for non-selected blocks can be reduced and erase disturbance can be also prevented, through the plurality of the wells. Further, capacitance between the triple P wells and the triple N well is reduced since triple P wells are divided. Therefore, well bias charging and discharging time can be reduced and an overall erase time budget can be thus reduced.

9 Claims, 4 Drawing Sheets

NAND FLASH MEMORY DEVICE AND METHOD OF FORMING A WELL OF A NAND FLASH MEMORY DEVICE

BACKGROUND OF THE DISCLOSURE

1. Field of the Disclosure

The disclosure generally relates to a NAND flash memory device and to a method of forming a well of the NAND flash memory device, and more particularly, to a well formed in a cell region of a NAND flash memory device.

2. Brief Description of Related Technology

Generally, in a NAND flash memory device, a cell is erased through a F-N tunneling phenomenon. The NAND flash memory cell is formed on a single P well. A number of the cells are constructed in a string shape to form a cell string. A number of the cell strings are arranged in the longitudinal or lateral direction to form a cell block. Accordingly, an erase operation is performed by the cell block.

FIGS. 1A and 1B are conceptual views shown to explain a conventional erase operation. Referring to FIGS. 1A and 1B, a voltage of 0V is applied to a word line W/L of a selected cell block through a string select transistor SSL. A word line W/L of a non-selected cell block is floated through the string select transistor SSL. If a high voltage is applied to a P well, the cell is erased since a voltage difference between a gate electrode and a well of a memory cell within the selected cell block is too great (see FIG. 1A) and the gate electrode of the memory cell within the non-selected cell block is boosted to reduce the voltage difference between the word line W/L and the well. The cell is thus not erased (see FIG. 1B).

However, since a voltage of 20V or more is generally applied to the P well, the non-selected cell block also undergoes stress due to the same bias. Further, there exists the leakage current due to a string select transistor for floating the word line of the non-selected cell block. The word line of the non-selected cell block does not keep floated due to this leakage. As a result, there is a problem in that the status of data is not kept since a shallow erase phenomenon occurs. In addition, there is a problem in that specifications of a target device are not met because erase disturbance is caused.

SUMMARY OF THE DISCLOSURE

Disclosed herein are a NAND flash memory device and a method of forming a well in the NAND flash memory device. Generally, in a region where a NAND flash memory cell will be formed, wells are divided and formed by a cell block, whereby a stress time for the cell block is reduced to prevent erase disturbance.

The NAND flash memory device includes a triple N well formed within a semiconductor substrate to electrically protect a number of memory cells in a predetermined region of the semiconductor substrate. The device also includes two or more triple P wells formed within the triple N well, and a number of cell blocks having a number of memory cell strings. The cell blocks are respectively formed on the triple P wells and share a number of bit lines, respectively.

According to another embodiment, a NAND flash memory device includes a semiconductor substrate in which a memory cell region and a peripheral region are defined. Such a device also includes one or more triple N wells formed within the memory cell region of the semiconductor substrate to electrically protect a number of memory cells, wells for peripheral devices formed within the peripheral region of the semiconductor substrate, one or more triple P wells formed within the triple N wells, a number of cell blocks formed on the triple P wells, respectively, wherein each of the cell blocks has a number of memory cell strings sharing a number of bit lines, and a number of transistors formed on the wells for the peripheral devices.

The method of forming a well of a NAND flash memory device includes forming a first mask through which the entire cell region is opened or the cell region is opened as much as a multiple of 2 or 3 on a P-type semiconductor substrate. The method also includes performing a N-type ion implant process using the first mask as an ion implant mask to form a triple N well within the P-type semiconductor substrate, forming a second mask through which the entire triple N well region of the semiconductor substrate in which the triple N well is formed is opened or the triple N well region is opened as much as a multiple of 2 or 3, and performing a P-type ion implant process using the second mask as an ion implant mask to form a triple P well within the triple N well.

Additional features of the invention may become apparent to those skilled in the art from a review of the following detailed description, taken in conjunction with the drawing figures and the appended claims.

BRIEF DESCRIPTION OF THE DRAWINGS

For a more complete understanding of the disclosure, reference should be made to the following detailed description and accompanying drawings wherein.

Figure 1A:
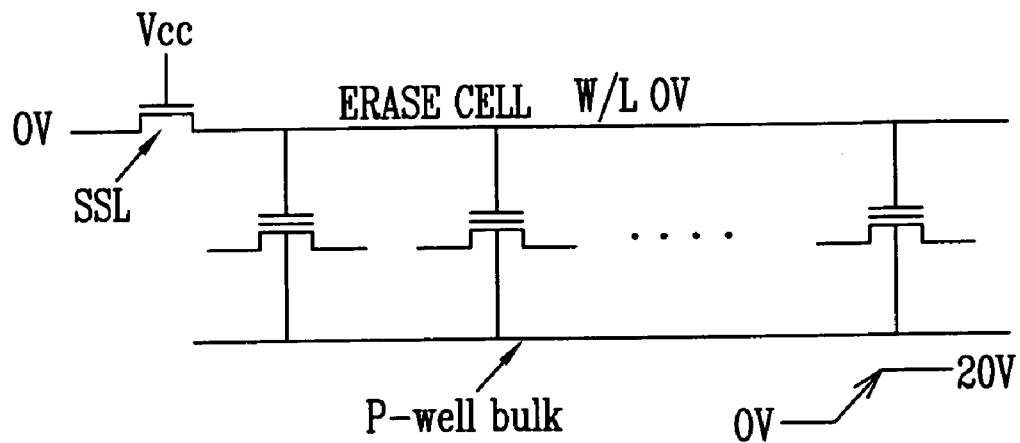
FIGS. 1A and 1B are conceptual views shown to explain a conventional erase operation.
Figure 1B:
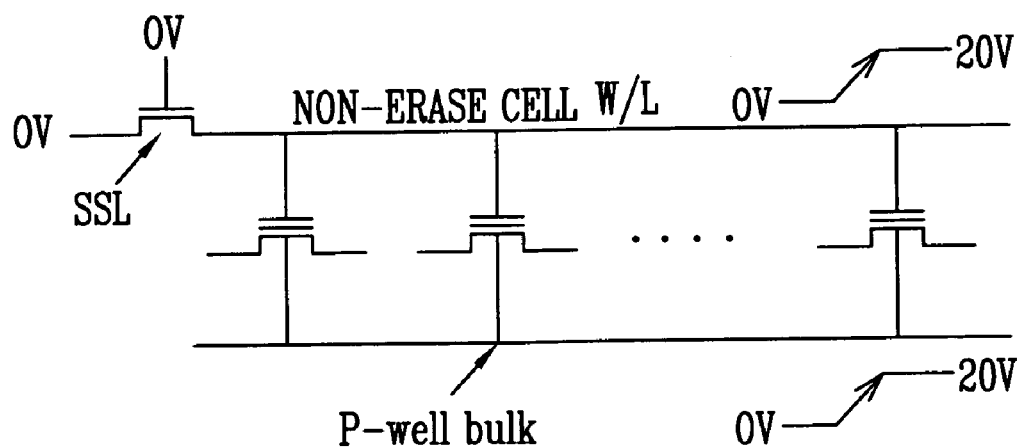

While the disclosed device and method are susceptible of embodiments in various forms, there are illustrated in the drawings (and will hereafter be described) specific embodiments, with the understanding that the disclosure and drawings are intended to be illustrative, and are not intended to limit the claimed invention to the specific embodiments described herein.

DETAILED DESCRIPTION OF THE PREFERRED EMBODIMENTS

Described below are the preferred embodiments according to the present invention will be described with reference to the accompanying drawings. Because the preferred embodiments are provided for the purpose that the ordinary skilled in the art are able to understand the present invention, they may be modified in various manners and the scope of the present invention is not limited by the preferred embodiments described later. Further, in the drawing, like reference numerals are used to identify the same or similar parts.

Figure 2A:
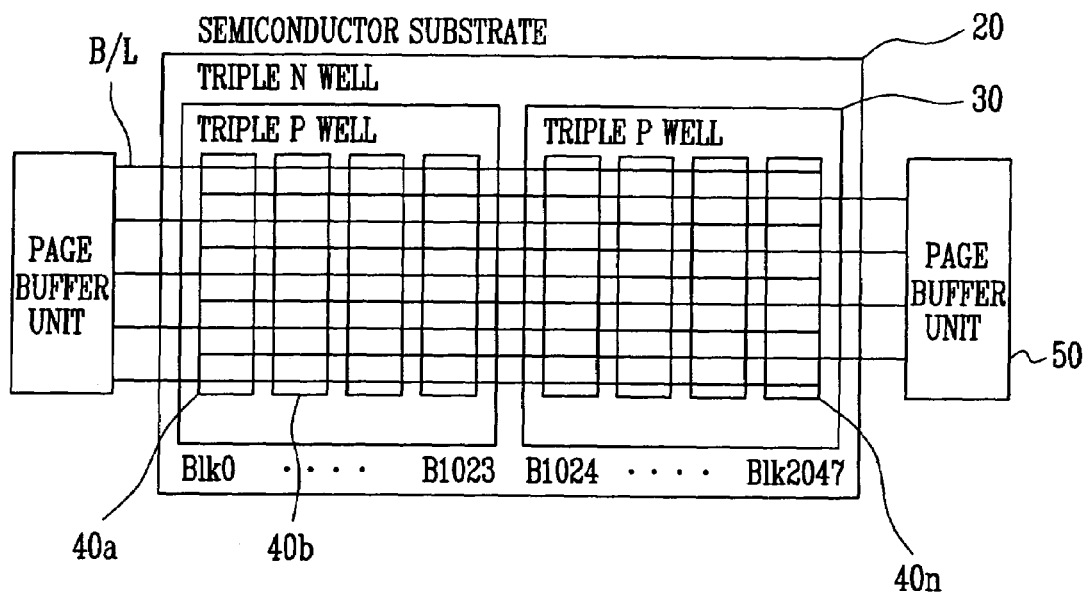
FIGS. 2A and 2B are conceptual views shown to explain a NAND flash memory device according to the present invention.
Figure 2B:
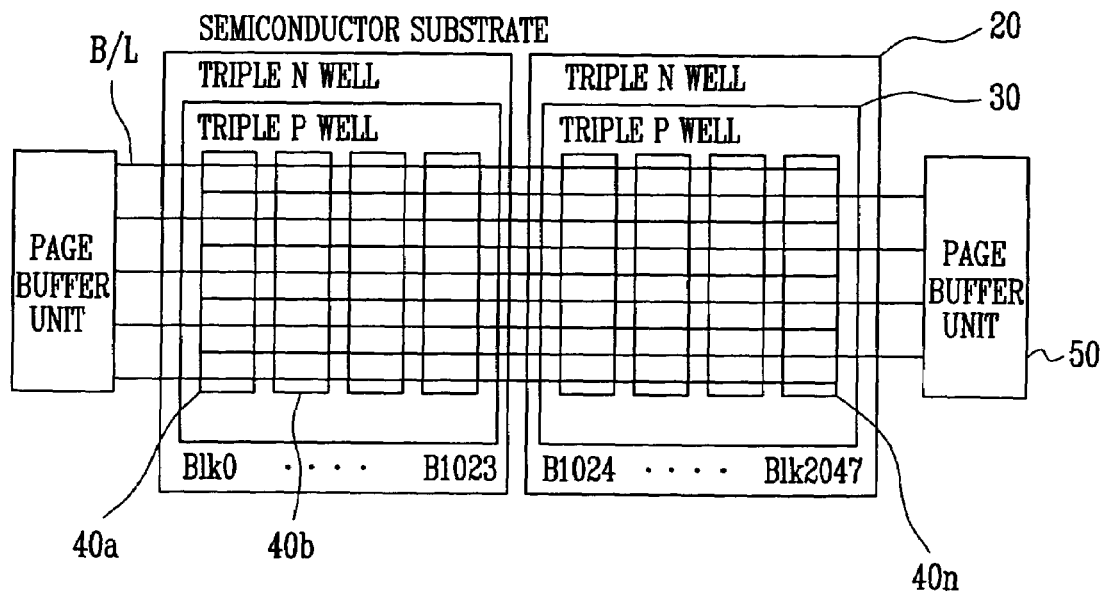

FIGS. 2A and 2B are conceptual views shown to explain a NAND flash memory device according to the present invention. Referring to FIGS. 2A and 2B, according to an embodiment of the present invention, the NAND flash memory device may include a triple N well 20 formed in a semiconductor substrate in order to electrically protect a number of memory cells in a given region of the semiconductor substrate, two or more triple P wells 30 formed within the triple N well 20, and a number of cell blocks 40a to 40n having a number of memory cell strings, wherein the cell blocks are formed on the plurality of the triple P wells 30 and have a number of bit lines B/L, respectively.

Further, according to another embodiment of the present invention, the NAND flash memory device may include a semiconductor substrate in which a memory cell region and a peripheral region are defined, one or more triple N wells 20 formed in the semiconductor substrate in order to electrically protect a number of memory cells in a given region of the semiconductor substrate, a well for peripheral devices (not shown) formed in a peripheral region of the semiconductor substrate, one or more triple P wells 30 which are respectively formed within the triple N wells 20, a number of cell blocks 40a to 40n having a number of memory cell strings, wherein the cell blocks are formed on the plurality of the triple P wells 30 and have a number of bit lines B/L, respectively, and a number of transistors (not shown) formed on wells for the peripheral devices.

Each of the cell blocks 40a to 40n includes a number of string select transistors (not shown) which are connected to the plurality of the bit lines B/L, respectively, and are driven according to a local string select signal, a number of source select transistors (not shown) which are connected to a common source line (not shown) and are driven according to a local source select signal (not shown), a number of cell strings in which a number of memory cells are connected in a string shape, wherein the cell strings are connected between the string select transistors (not shown) and source select transistors, respectively, and a number of word lines (not shown) connected to gate terminals within the cell string, respectively.

The NAND flash memory device may further include page buffer units 50 which are connected to the number of bit lines B/L, respectively, for applying a given program voltage or a read voltage to the bit lines B/L according to an external control signal. The page buffer unit 50 preferably includes a number of page buffers, which are located at the top and bottom of the cell region and each share two even and odd bit lines.

In this embodiment, the cell blocks as many as the number of 10242 may share the number of the bit lines B/L, respectively. That is, the string select transistors at the same location within the 1st to 2047th cell blocks are connected to the same bit line. For example, it is assumed that there are 1024 bit lines and 1024 string select transistors exist within each of the cell blocks. The 1st string select transistors within each of the cell blocks are connected to the 1st bit line and the 1024th string select transistors are connected to the 1024th bit line. Further, the triple P wells 30 can be divided in a variety of shapes and the number of the cell blocks existing within the triple P wells may vary. In this embodiment, if the triple N well 20 is one, it is preferred that the triple P wells 30 are divided in a multiple of 2 or 3 and are formed. If the triple N well 20 is one or more, the triple P wells 30 are preferably divided in a multiple of 1, 2 or 3 and are formed. Also, the triple N wells can be divided in a multiple of 1 or 2 and are formed. Moreover, the number of the cell blocks 40 located within one triple P well 30 is divided in a multiple of 2 or 3 of a total of the cell blocks 40a to 40n. In other words, if the triple P wells 30 are divided into 2, the entire cell blocks 40a to 40n are divided into ½ and are respectively located on the triple P wells 30 by ½. The triple P wells are formed on the cell regions that are divided into 2, respectively.

In a flash memory device of a NAND type in which an erase operation using a bulk bias is performed with the F-N tunneling method, the well of the cell array has a structure in which the triple N well 20 is formed in a P-type semiconductor substrate and the triple P wells 30 to be used as a bulk of the cell array is formed within the triple N well 20, so that the triple P wells 30 are electrically isolated from the P substrate of the same type in a P-N diode mode. Accordingly, electrons of the floating gate are emitted by high voltages of different potentials by applying a voltage of 0V to the word lines and a high voltage of over 20V to the bulk during an erase operation. In this time, if there are 2048 blocks, there may be a 2047th non-selected block if the erase operation is performed in a block unit. That is, if a 1 pulse time for erasure is 2 ms, 2047×2 ms=41 sec. If enable cycling is 100K, the flash memory device undergoes stress during 4.1 Msec.

Therefore, according to the present invention, 2048 cell blocks 40a to 40n are connected to the same global bit line in parallel and the triple P wells 30 are divided to form two triple P wells 30. Then, if 1024 blocks are positioned in one triple P well 30 and the P wells are coded individually, the stress time reduces to ½. If 4 triple P wells 30 are formed, the stress time reduces to ¼. If the P well 30 is divided, the block is also divided into 1024 in number. Accordingly, during the erase operation, a P well 30 having a selected block undergoes stress since it is applied with 20V. However, a P well 30 not having a selected block does not experience stress since it is applied with 0V.

Figure 3:
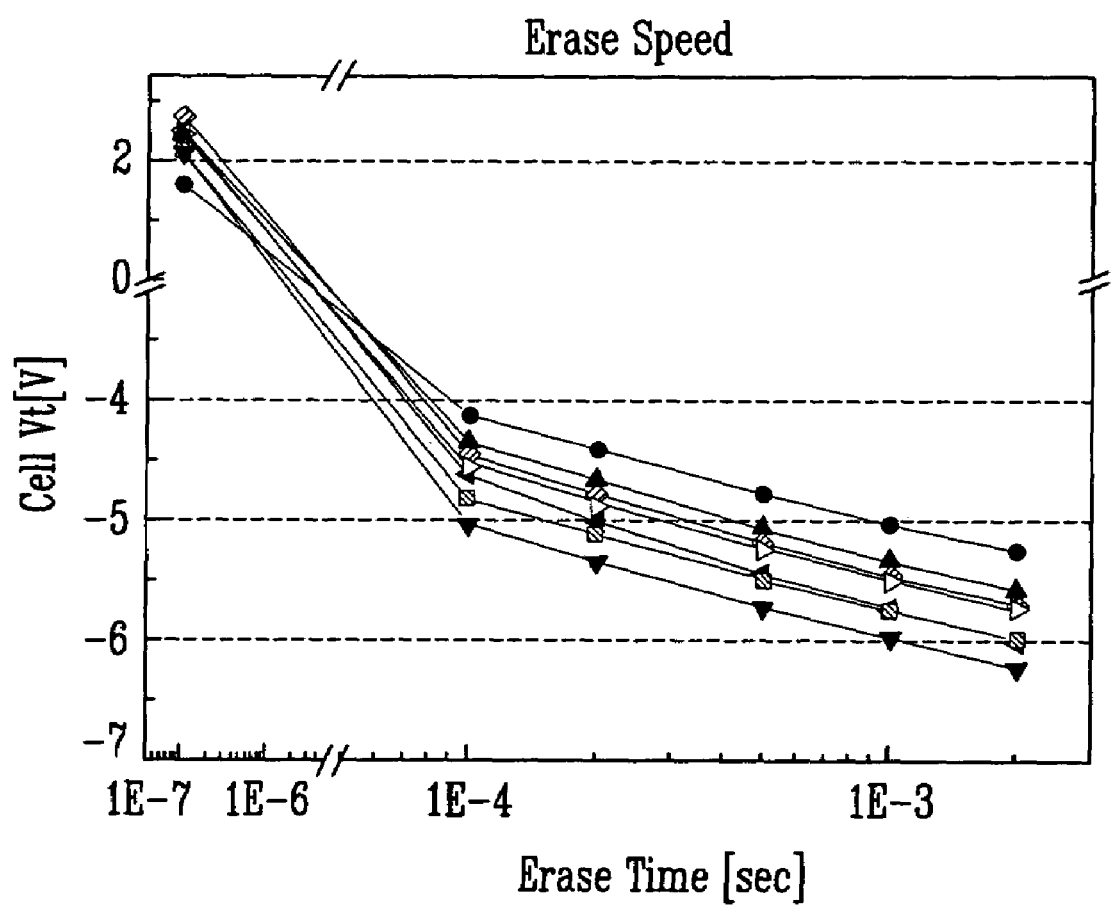
FIG. 3 is a graph showing the relationship between an erase time and an erase speed.

FIG. 3 is a graph showing the relationship between an erase time and an erase speed. As shown in FIG. 3, whenever the stress time reduces to ½, an erase time reduces about 0.3V. It is thus possible to prevent disturbance due to erase stress. Moreover, since the triple P wells 30 are divided, capacitance between the triple P wells 30 and the triple N well 20 reduces. Thus, an overall erase time budget can be reduced because well bias charging and discharging time reduce.

Figure 4A:
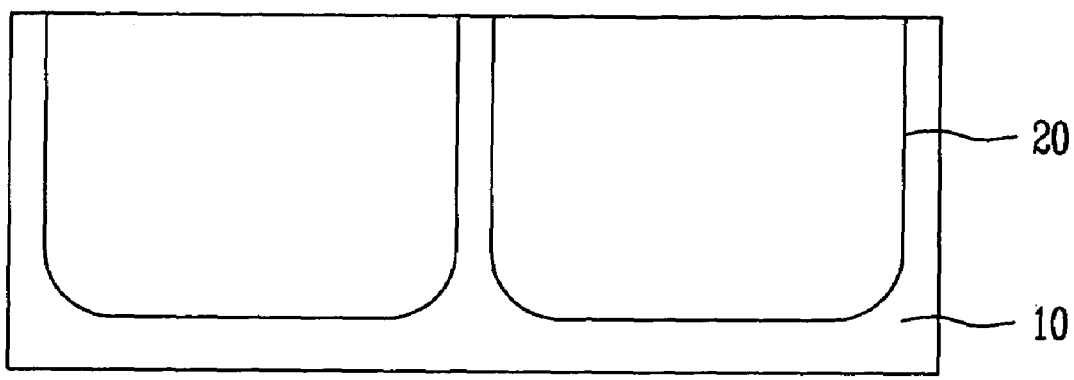
FIGS. 4A and 4B are cross-sectional views for explaining a method of a well in a NAND flash device according to the present invention.
Figure 4B:
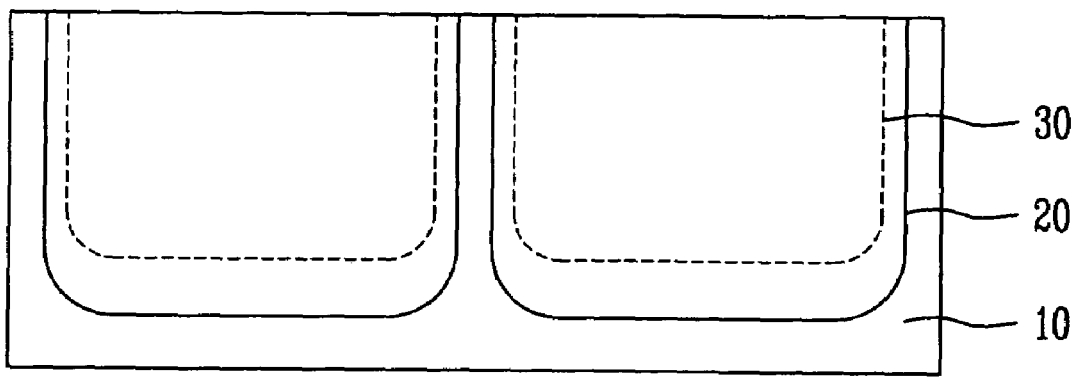

A method of forming a well in a NAND flash device according to the present invention will now be described with reference to the accompanying drawings. FIGS. 4A and 4B are cross-sectional views for explaining the method of the well in the NAND flash device according to the present invention. Referring to FIG. 4A, a first mask (not shown) for ion implant through which a given cell region is opened is formed on a P-type semiconductor substrate 10. A N-type ion implant process is performed to form triple N wells 20 within the P-type semiconductor substrate 10. The first mask may open the entire cell region or the cell region as much as a multiple of 2 or 3. Thereby, the triple N wells 20 are formed in the entire cell region or the triple N wells 20 as much as a multiple of 2 or 3 are formed in the cell region.

Referring to FIG. 4B, a second mask (not shown) through which the triple N wells 20 are opened is formed in the cell region of the semiconductor substrate 10 in which the triple N wells 20 are formed. A P-type ion implant process is performed to form triple P wells 30 within the triple N wells 20. At this time, the second mask can open the entire triple N well 20 region or the triple N well 20 region as much as a multiple of 2 or 3.

In this embodiment, a single triple N well 20 can be formed in the cell region of the P-type semiconductor substrate 10 and two triple P wells 30 can be formed within the triple N well 20. Or, two triple N wells 20 can be formed in the cell region of the P-type semiconductor substrate 10 and the triple P wells 30 can be formed within the two triple N wells 20, respectively. In this time, a P well (not shown) for low voltage NMOS and an N well (not shown) for low voltage PMOS can be formed in a region where a low voltage device will be formed through a subsequent process. Thereafter, a tunnel oxide film (not shown), a floating gate (not shown), a dielectric film (not shown) and a control gate (not shown) are formed on the triple P well 30 through predetermined processes, thereby forming flash memory cells (not shown).

Interlayer insulating films (not shown) for isolating the flash memory cells are formed. The interlayer insulating films are patterned to form contact plugs (not shown) and bit lines are then formed on the contact plugs.

As described above, according to the present invention, triple wells of a NAND flash memory device are formed within a cell region in plural. A cell block including flash memory cells is formed on the triple wells. Accordingly, during an erase operation of a flash memory device, a stress time for non-selected blocks can be reduced and erase disturbance can be prevented, through the plurality of the wells. Further, as triple P wells are divided, capacitance between the triple P wells and the triple N well reduces. Therefore, well bias charging and discharging time can be reduced and an overall erase time budget can be thus reduced.

The foregoing description is given for clearness of understanding only, and no unnecessary limitations should be understood therefrom, as modifications within the scope of the invention may be apparent to those having ordinary skill in the art.

What is claimed is:

1. A NAND flash memory device comprising:
 a semiconductor substrate in which a memory cell region and a peripheral region are defined;
 triple N well regions formed in the memory cell region of the semiconductor substrate to electrically protect a plurality of memory cells;
 well regions formed in the peripheral region of the semiconductor substrate;
 P well regions individually formed in each N well region;
 a plurality of cell blocks formed on each triple P well region, wherein each of the cell blocks includes first memory cell strings sharing even bit lines and second memory cell strings sharing odd bit lines;
 a plurality of transistors formed on the well regions;
 a first page buffer unit coupled to the first memory cell strings formed over different triple N well regions through the even bit lines; and
 a second page buffer unit coupled to the second memory cell strings formed over different triple N well regions through the odd bit lines.

2. A NAND flash memory device comprising:
 two or more triple N well regions formed in a semiconductor substrate to electrically protect a plurality of memory cells;
 P well regions individually formed in each triple N well region; and
 a plurality of cell blocks formed on each P well region and including first memory cell strings sharing even bit lines and second memory cell strings sharing odd bit lines;
 a first page buffer unit coupled to the first memory cell strings formed over different triple N well regions through the even bit lines; and
 a second page buffer unit coupled to the second memory cell strings formed over different triple N well regions through the odd bit lines.

3. The NAND flash memory device of claim 2, wherein the number of triple N well regions is a multiple of 2 to 3.

4. The NAND flash memory device of claim 2, further comprising:
 well regions for peripheral devices formed in a peripheral region of the semiconductor substrate; and
 a plurality of transistors formed on the well regions.

5. A NAND flash memory device comprising:
 a triple N well region formed in a memory cell region of a semiconductor substrate;
 two or more triple P well regions formed in the triple N well region;
 a plurality of cell blocks formed on each P well region and including first memory cell strings sharing even bit lines and second memory cell strings sharing odd bit lines;
 a first page buffer unit coupled to the first memory cell strings formed over different triple N well regions through the even bit lines; and
 a second page buffer unit coupled to the second memory cell strings formed over different triple N well regions through the odd bit lines.

6. The NAND flash memory device of claim 5, wherein the number of triple P well regions is a ultiple of 2 or 3.

7. The NAND flash memory device of claim 5, further comprising:
 well regions for peripheral devices formed in a peripheral region of the semiconductor substrate; and
 a plurality of transistors formed on the well regions.

8. A NAND flash memory device comprising:
 a semiconductor substrate in which a memory cell region and a peripheral region are defined;
 a triple N well region formed in the memory cell region of the semiconductor substrate;
 well regions formed in the peripheral region of the semiconductor substrate;
 two or more triple P well regions formed in the triple N well region,;
 a plurality of cell blocks formed on each triple P well region, wherein each of the cell blocks includes first memory cell strings sharing even bit lines and second memory cell strings sharing odd bit lines;
 a plurality of transistors formed on the well regions;
 a first page buffer unit coupled to the first memory cell strings formed over different triple N well regions through the even bit lines; and
 a second page buffer unit coupled to the second memory cell strings formed over different triple N well regions through the odd bit lines.

9. The NAND flash memory device of claim 8, wherein the number of triple P well regions is a multiple of 2 or 3.

* * * * *